United States Patent [19]
Tuttle et àl.

[11] Patent Number: 5,621,913
[45] Date of Patent: Apr. 15, 1997

[54] SYSTEM WITH CHIP TO CHIP COMMUNICATION

[75] Inventors: Mark E. Tuttle; John R. Tuttle, both of Boise, Id.

[73] Assignee: Micron Technology, Inc., Boise, Id.

[21] Appl. No.: 340,016

[22] Filed: Nov. 15, 1994

Related U.S. Application Data

[63] Continuation of Ser. No. 989,246, Dec. 11, 1992, abandoned, which is a continuation-in-part of Ser. No. 894,879, Jun. 8, 1992, Pat. No. 5,300,875, and Ser. No. 884,507, May 15, 1992, abandoned.

[51] Int. Cl.$^6$ ........................................... H04B 1/40
[52] U.S. Cl. .................. 455/90; 455/66; 455/74; 455/41; 327/564
[58] Field of Search .................. 455/41, 66, 74, 455/90, 899, 300, 333, 49.1; 257/275, 277, 6–8; 368/204, 209; 320/54; 343/726, 720, 721; 327/564–566; 359/163, 169, 152, 154, 157, 159; 375/259

[56] References Cited

U.S. PATENT DOCUMENTS

| | | | |
|---|---|---|---|
| 4,724,427 | 2/1988 | Carroll | 340/572 |
| 4,809,009 | 2/1989 | Grimes et al. | 343/726 |
| 4,857,893 | 8/1989 | Carroll . | |
| 4,911,217 | 3/1990 | Dunn et al. | 152/152.1 |
| 4,941,207 | 7/1990 | Maeda et al. | 455/300 |
| 5,231,646 | 7/1993 | Heath et al. | 375/1 |
| 5,300,875 | 4/1994 | Tuttle | 320/20 |
| 5,335,361 | 8/1994 | Ghaem | 455/66 |

FOREIGN PATENT DOCUMENTS

| | | | |
|---|---|---|---|
| 52-36064 | 3/1977 | Japan | 368/209 |
| 0571786 | 9/1977 | U.S.S.R. | 368/204 |
| 2150382 | 6/1985 | United Kingdom | 359/163 |

*Primary Examiner*—Reinhard J. Eisenzopf
*Assistant Examiner*—Nguyen Vo
*Attorney, Agent, or Firm*—Stanley N. Protigal; William R. Bachand; Robert J. Stern

[57] ABSTRACT

A system for wireless communication between a plurality of semiconductor chips is disclosed. Each data line in the present invention is coupled with a transmitter for transmitting information to any other semiconductor chip. Furthermore, each data line is coupled with a receiver for receiving information transmitted by any transmitter. The system also comprises multiple antennas, fabricated from the chip's metalization layer. Nonetheless, separate antennas within the chip packaging can also be used. The antenna unit comprises a dipole and a loop antenna in a planar arrangement, thereby forming a spherical electromagnetic pattern of coverage and making the orientation between semiconductor chips for transmission purposes substantially irrelevant. Each transmitter in the system comprises a modulator for modulating the information being transmitted, while each receiver comprises a demodulator for demodulating the information transmitted. Several modulation schemes can be employed, though amplitude modulation is preferred, whereby each transmitter has a distinct carrier frequency within the operative radio frequency spectra—preferably above 900 MHz. Each transmitter and receiver is coupled to a power source comprising a capacitor, as a signal generator, and a rectifying circuit. To ensure that the communication between chips is noise/interference free, the entire system is shielded with a metal housing.

21 Claims, 4 Drawing Sheets

SYSTEM WITH CHIP TO CHIP COMMUNICATION

CROSS REFERENCE TO RELATED APPLICATIONS

This is a continuation of application Ser. No. 07/989,246, filed Dec. 11, 1992 now abandoned. which application is a continuation-in-part of application Ser. No. 07/894,879 filed Jun. 8, 1992, now U.S. Pat. No. 5,300,875 dated Apr. 5, 1994, and application Ser. No. 07/884,507 filed May 15, 1992, now abandoned, continued in Ser. No. 08/137,699, now abandoned, both commonly assigned with the present invention.

FIELD OF THE INVENTION

This invention relates to communications and means for linking semiconductor chips. More particularly, the invention relates to a wireless radio frequency ("RF") communications link between two or more semiconductor chips.

BACKGROUND OF THE INVENTION

The continuing trend towards expanding the capabilities of computer related products has raised significant issues. As products dependent on advanced electronics have become more complex, a larger number of semiconductor chips have been required. Moreover, there has been a demand to reduce the dimensions of these new sophisticated products. As such, a growing need has developed to utilize the space within the product's housing more effectively.

As with most computer related products, a predominant amount of space is allocated within the housing for wire traces and buses which couple semiconductor chips together. The reliance on printed wiring or printed circuit boards, particularly trace and bus wiring for linking semiconductor chips, has several shortcomings. Printed wiring or printed circuit boards spread out the chips in a plane, taking up a large amount of area.

Moreover, when coupling chips on a board, trace and bus wires must first be fabricated by an etching process to form interconnects. Conductive connections with the chips are then formed by permanently soldering the chips' pins to the wire buses. This method of linking chips is subject to a large number of manufacturing defects, particularly in the solder bonds. As such, the overall cost of the manufacturing process is increased high.

Further, each chip on a printed wiring or printed circuit board must rely on a pad within the chips to which a pin on a metal lead frame is bonded. This enables each input/output of the chip to interface with the remainder of the board. However, the wire bonding process used to connect the pad to the lead frame lowers the overall reliability of the chip. Additionally, the reliability of the boards themselves becomes an issue after repeated use. Because of the permanent connection between the chip and the board, the entire board, with its total cost, must be replaced when one chip fails.

SUMMARY OF THE INVENTION

The primary object of the present invention is to eliminate the aforementioned drawbacks of the prior art.

Another object of the present invention is to provide a system for coupling semiconductor chips where chips can be easily added and/or removed without regard to the physical constraints of a printed circuit board or interconnect.

A further object of the present invention is to provide a system for coupling semiconductor chips which can be easily upgraded by removing outdated semiconductor chips and replacing them with the latest, more powerful and improved versions.

Still another object of the present invention is to provide a system for coupling semiconductor chips which allows for the replacement of semiconductor chips regardless of pin layout.

Yet another object of the present invention is to provide a system for coupling semiconductor chips which has an improved overall reliability and a reduced cost to manufacture.

It is a further object of the present invention to provide a system for coupling semiconductor chips which allows the space within a housing to be used more efficiently.

Still another object of the present invention is to provide a system for coupling semiconductor chips which eliminates the need for soldering chips onto a printed circuit board, allowing them to be stacked.

These hereinabove objects, as well as others which will become apparent hereafter, are achieved in a system for wireless communication between a plurality of semiconductor chips. Each data line, otherwise connected to a pad in the known art, in the present invention is coupled with a transmitter for transmitting information to any other semiconductor chip. Furthermore, each data line is coupled with a receiver for receiving information transmitted by any transmitter. The system also comprises multiple antennas, fabricated from the chip's metalization layer, preferably an aluminum alloy. Nonetheless, separate antennas within the chip packaging can also be used. The antenna unit preferably comprises at least one dipole and one loop antenna in a planar arrangement, thereby, forming a spherical electromagnetic pattern of coverage and making the orientation between semiconductor chips for transmission purposes substantially irrelevant. Each transmitter in the system comprises a modulator for modulating the information being transmitted, while each receiver comprises a demodulator for demodulating the information transmitted. Several modulation schemes can be employed, though amplitude modulation is preferred, whereby each transmitter has a distinct carrier frequency within the operative radio frequency spectra—preferably above 900 MHz. Each transmitter and receiver is provided with a power source for supplying voltage and current. The power supply preferably comprises a capacitor and a passive means for recharging, such as a signal generator for generating a signal and a rectifying circuit for rectifying the signal into a direct current voltage. Further, to ensure that the communication between chips is noise/interference free, the entire system is shielded with a metal housing.

BRIEF DESCRIPTION OF THE DRAWINGS

The present invention will be better understood from reading the following description of non-limitative embodiments, with reference to the attached drawings, wherein below:

FIG. 6 is a functional block diagram of a power supply and a passive means for recharging the power supply; and FIG. 7 is a functional block diagram of a passive means for recharging which employs a signal generator for generating a signal and a rectifying circuit for rectifying the signal into a direct current voltage to provide a recharge means.

DETAILED DESCRIPTION OF THE INVENTION

Figure 1:
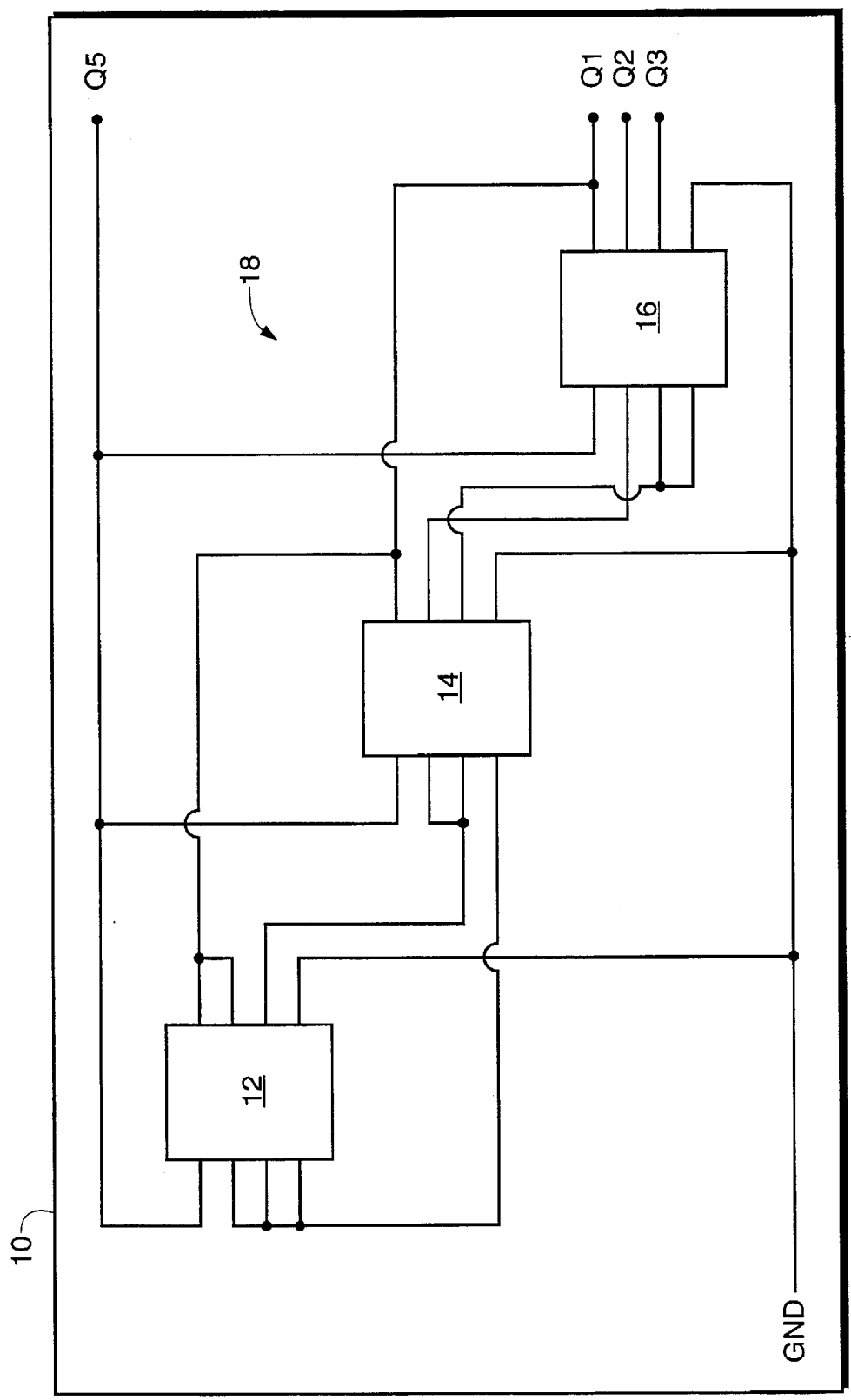
FIG. 1 is an illustration of a traditional printed circuit board which relies on traditional wire buses for coupling semiconductor chips together.

Referring to FIG. 1, traditional printed wiring or printed circuit board 10 is shown employing bus wiring for linking semiconductor chips. Each semiconductor chip 12, 14, and 16 is coupled to printed wiring or printed circuit board 10 via several wire buses 18. Conductive joints between each chip and the printed wiring or printed circuit board are formed by permanently soldering the pins of each chip to wire buses 18. This approach of linking chips is subject to a large number of manufacturing defects, particularly in the solder bonds, increasing the overall cost of the manufacture and decreasing the reliability of the printed wiring or printed circuit board.

Figure 2:
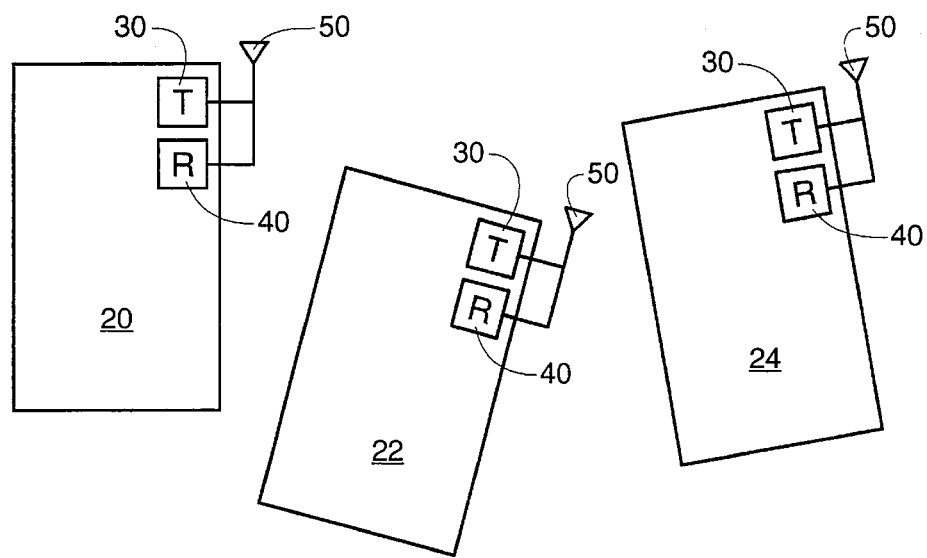
FIG. 2 is an illustration of an embodiment of the present invention which relies on a transmitter and receiver for coupling semiconductor chips together.

Referring now to FIG. 2, a system for wireless communication between a plurality of semiconductor chips is depicted. In order to replace the prior art approach of coupling semiconductor devices by wire buses, the present invention relies on RF communications technology as a means for linking several semiconductor chips. Fundamentally, such a wireless system must comprise a transmitter and receiver, also commonly known as a transceiver.

In FIG. 2, a plurality of chips 20, 22, and 24 are shown spaced apart. Each chip 20, 22, and 24 comprises a transmitter 30, a receiver 40 and an antenna unit 50 to eliminate the need for wire buses. In operation, information processed by chips 20, 22, and 24 is outputted by that chip's respective transmitter 30. Transmitter 30, being coupled to antenna unit 50, transmits its chip's information processed in the form of electromagnetic energy into the free space area around chips 20, 22, and 24. Subsequently, one chip's receiver 40 receives, through its antenna unit 50, the information as transmitted by transmitter 30. The information received by receiver 40 is then fed into the chip for further processing.

In the preferred embodiment of the present invention, in order to accomplish the above transmission and reception, each chip's transmitter 30 and receiver 40 incorporates an amplitude modulation ("AM") scheme operating at different carrier frequencies. Under the AM scheme, each distinct carrier frequency is preferably within the operative radio frequency spectra—above 900 MHz. The transmitter and receiver alternatively could also employ frequency modulation, phase shift key modulation, frequency shift key modulation, or multiphase frequency shift key modulation. In another embodiment of the present invention, time division multiplexing and a coding scheme known to those skilled in the art may be used to facilitate transmission and reception between chips 20, 22 and 24. Nonetheless, there are many alternate schemes applying communications theory that one of ordinary skill in the art could devise to promote the present invention.

Furthermore, in the preferred embodiment, each data output of each chip comprises a transmitter and receiver, while sharing the antenna unit. As such, parallel communication between data outputs of one chip and data inputs of another or several others can be enabled. Alternatively, however, each chip could comprise only one transmitter and one receiver, such that the transmitter and receiver are shared by the data outputs thereby exhibiting serial communication characteristics.

Additionally, the entire system should be shielded with a metal housing. This is to prevent stray electromagnetic radiation as well as unintended coupling of energy generated by other systems not related to the present invention from interfering with the present invention's operation. One of ordinary skill in the art could devise a housing which ensures noise/interference free communication between chips.

Figure 3:
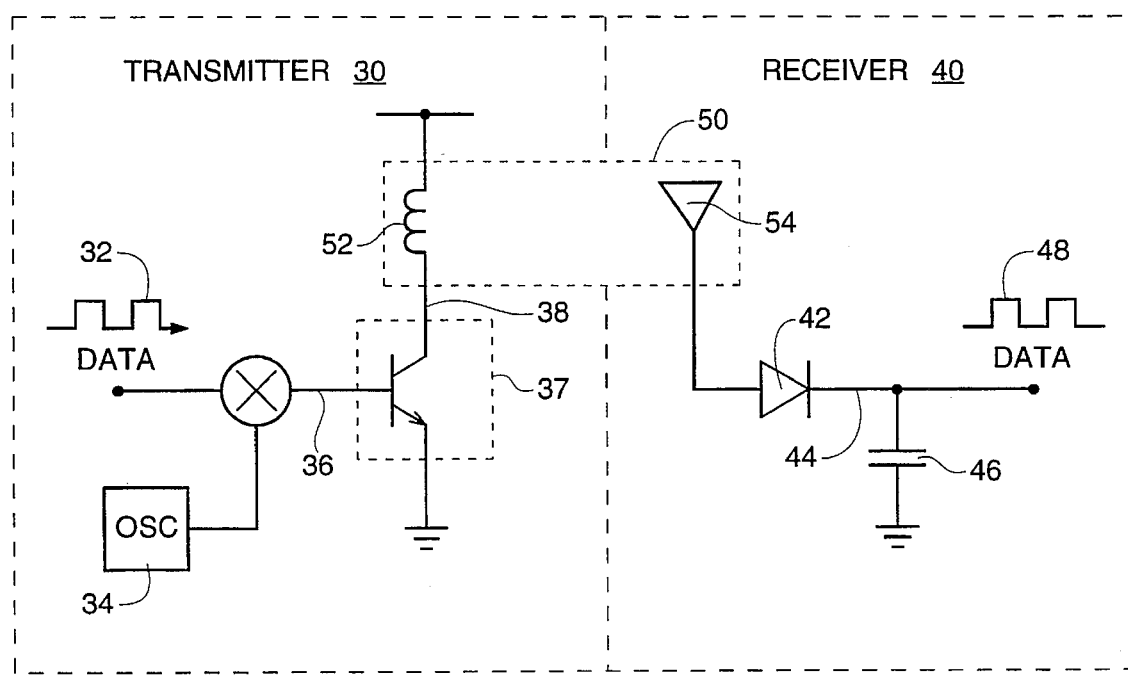
FIG. 3 is a functional block diagram of portions of the transmitter and receiver pair shown in FIG. 2.

Referring to FIG. 3, the system for wireless communication between semiconductor chips is further illustrated according to the preferred embodiment. FIG. 3 shows a design for transmitter 30, though one of ordinary skill in the art could devise feasible alternatives which could also be applied in the present invention.

Transmitter 30 comprises three stages. In the first stage, data 32 is modulated by mixing the data with the outpart of oscillator 34. The frequency of the oscillator must be sufficiently distinct under the AM scheme to allow for simultaneous transmission by several transmitters within the system.

In the second stage of transmitter 30, the then modulated data 36 is amplified by means of a single stage amplifier 37 to produce an amplified modulated data output 38. A single bipolar junction or metal oxide semiconductor transistor will provides sufficient gain. Nonetheless, as the purpose of the present invention is to provide a simplified means of communication between semiconductor chips whereby overall size is a concern, the selection of transistor type is dependent on the transistors used in the semiconductor chip as a whole.

In the third and final stage of transmitter 30, the output of amplification stage 37, amplitude modulated data 38, is fed into a transmitter antenna 52 of antenna unit 50. The coupling of amplification stage 37 and transmitter antenna 52 enables amplitude modulated data 38, in the form of electromagnetic energy, to be transmitted in accordance with the wave equation. The resultant energy, is transmitted into free space.

FIG. 3 also shows a design for receiver 40 design is depicted, though one of ordinary skill in the art could devise feasible alternatives applicable to the present invention. Receiver 40 comprises three stages. In the first stage, electromagnetic energy in fall space is received by a receiver antenna 54 of antenna unit 50.

In the second stage of receiver 40, the received signal is demodulated by a demodulator 42 to supply a demodulated signal 44. Demodulated signal 44 is a result of the direct coupling between demodulator 42 and receiver antenna 54. Demodulation 42 is fabricated from a diode component. In an alternate embodiment demodulator 42 preferably comprises a transistor structure with selection of transistor type dependent on the semiconductor chip.

In the third and final stage of receiver 40, demodulated signal 44 is filtered by low pass filter 46 to provide data input 48. Data input 48 is subsequently employed by the chip of receiver 40 for processing purposes. Preferably, low pass filter 46 comprises a simple capacitor. Nonetheless, low pass filter 46 can be realized in a variety of ways obvious to one of ordinary skill in the art.

Figure 4:
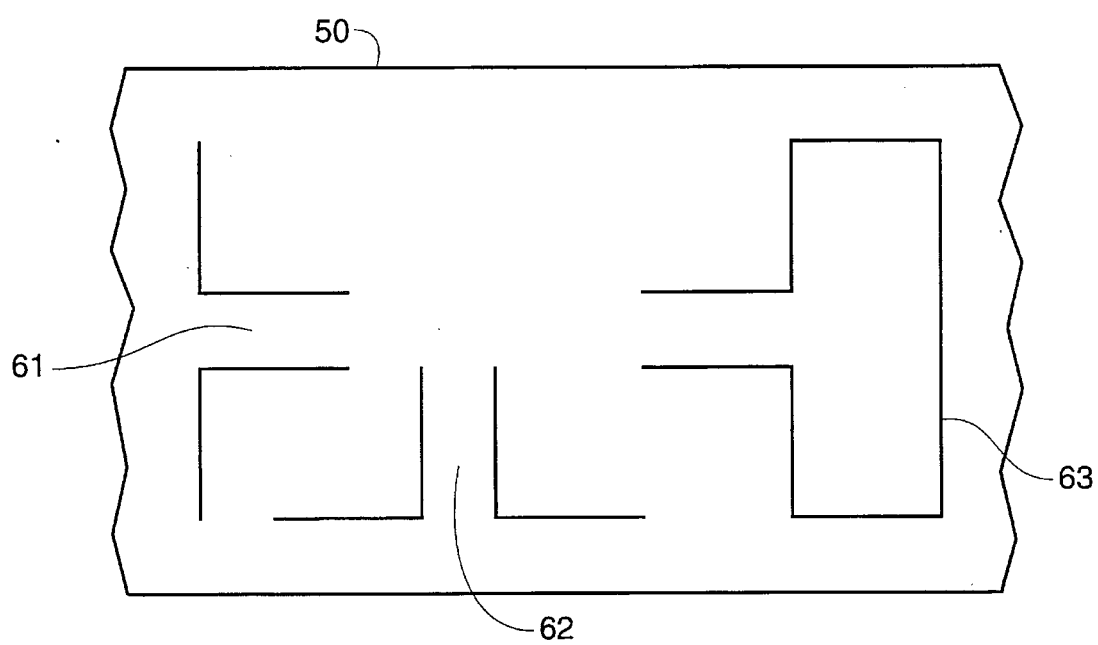
FIG. 4 is a top view of the antenna unit shown in FIG. 3 having several dipole antennas and a loop antenna for forming a spherical electromagnetic pattern of coverage and making the orientation between semiconductor chips for transmission purposes substantially irrelevant.

Referring now to FIG. 4, antenna unit 50 is depicted. In the preferred embodiment of the present invention, antenna unit 50 comprises two dipole antennas (61 and 62) and a loop antenna 63. Nonetheless, a singular dipole, loop, or other antenna can also be employed. As a radio frequency signal, will generate a toroidal shaped electromagnetic field centered about a dipole antenna, the particular antenna configuration depicted in FIG. 4 will effectively achieve a nearly spherical electromagnetic field pattern.

In the preferred embodiment of the present invention, the antennas of the configuration of FIG. 4 are interconnected in parallel. Dipole antennas 61 and 62 are spaced approximately 90° from each another, preferably in a half wave configuration. Further, loop antenna 63 is spaced approximately 90° from the axis of antenna 12.

To simplify fabrication of the present invention, antennas 61, 62, and 63 are all processed directly from the metalization layer of each semiconductor chip of the system. In an alternate embodiment of the present invention, however, antennas 61–63 are fabricated from a substrate (not shown) operably positioned superjacent or subjacent semiconductor chip 10. In this design, each pad (not shown) on the chip is coupled to the substrate by a wire bond.

The combination of the three antenna patterns—dipole and loop antennas 61, 62, and 63—reduces and/or eliminates the lack of field on the axis of the dipole antennas, all the while using only antenna geometries lying within a two-dimensional plane of the metalization layer. Since the combined coverage is approximately spherical, the orientation between semiconductor chips involved in transmitting and receiving becomes substantially irrelevant.

Figure 5A:
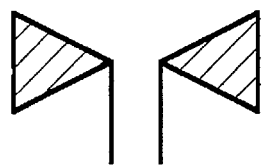
FIG. 5(a) through (c) are top views of alternate antennas of the present invention.
Figure 5B:
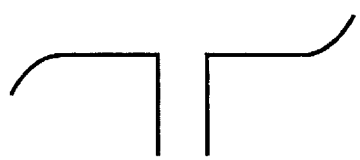
Figure 5C:
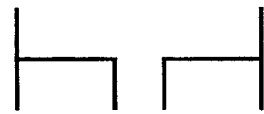

The dipole antennas of FIG. 4 may be replaced by an unlimited number of configurations, such as the antenna configurations represented in FIGS. 5(a)–5(c). However, to gain the optimum spherical electromagnetic field pattern, it is preferred to have both dipole antennas placed at approximately 90° to one another. Further, loop antenna 63 is depicted in a rectangular layout in FIG. 4. In an alternate embodiment, antenna 63 is formatted in a circular shape. A variety of antenna configurations can be devised by one skilled in the art providing for a more optimum spherical pattern coverage or for achieving different impedance characteristics. Although the orientation of FIG. 4 is preferred, it is one intent of the present invention to demonstrate a means for spherical pattern coverage from antennas lying in a two-dimensional plane. Utilizing this scheme, the physical orientation between semiconductor chips is irrelevant with respect to the present wireless communication system.

Referring to FIG. 6, a power supply for each semiconductor chip is illustrated. One intent of the preferred embodiment of the present invention is to eliminate the need for all wire buses, including those involving the power supply, in the application of semiconductor chips. The present invention, however, can also be constructed such that each chip comprises a minimal number of leads for coupling to a power source.

In order to provide a wireless power supply to each chip, several alternatives exist to circumvent the need for wire bus power leads. Any one of the devices described hereinbelow or any combination thereof may be used to present energy in the form of an alternating current ("AC") or direct current ("DC") voltage.

In the preferred embodiment of the present invention, an electromagnetic power source is employed as a means for supplying sufficient power for each semiconductor chip to function as well as transmit and receive information. Referring to FIG. 7, an electromagnetic voltage source 80 is depicted having a broadcast frequency sufficiently spaced from the frequency spectra of the wireless communication system to avoid interference. The broadcast frequency of electromagnetic voltage source 80 should be selected from a range between 60 Hz and 10 MHz.

Further, each semiconductor chip comprises a power antenna 82 for reception of the electromagnetic signal from electromagnetic voltage source 80. Upon its reception, the electromagnetic voltage signal is rectified by diode 86 coupled in series with current limiting resistor 84. Thereafter, the resultant energy is applied to capacitor 87 creating a voltage across terminals 88 and 89. Applying this design, a constant power source can be provided to each system chip, all the while eliminating the need for a power wire bus.

Preferably, electromagnetic voltage source 80 will generate a constant signal to provide a constant source of power. However, in the alternative, electromagnetic voltage source 80 could be employed as a means for recharging a battery 94 through recharging circuitry 96 and thus, be required to only transmit periodically. In such a scheme, antenna 82 first receives the electromagnetic signal. The signal, being inputted into recharging circuitry 96, is rectified and the resultant energy is used to recharge battery 94 by trickle charging. It should be obvious to one skilled in the art that any of the hereinbelow approaches for providing power could also be employed to periodically recharge the battery 94 or capacitor 87.

In another embodiment of the invention, a photovoltaic cell(s) 90, preferably mounted on each chip, is employed for providing the chip with a power source. An external light source (not shown) replace electromagnetic voltage source 80. Cell 90, in the face of light energy, generates a voltage to charge capacitor 87 or recharge battery 94 as described above.

In another embodiment, acoustic transducer 92 is substituted for, or used in conjunction with, photovoltaic cell 90 to provide a power source. In such a scheme, an acoustic transducer 92 receives acoustic energy from an acoustic generator (not shown) in place of electromagnetic voltage source 80. This energy may fall within the ultrasonic portion of the frequency spectrum. Transducer 92 generates a voltage to charge capacitor 87 or recharge battery 94 as described above.

Although the present invention requires additional circuitry, antenna unit 50, transmitter 30, and receiver 40 take up relatively little space and add little to process complexity. The transistor count required to accomplish the present invention is approximately 8,000. Nonetheless, as is the case with ultra large scale integration ("ULSI"), such as a 64 MHz microprocessor or 64 Megabit dynamic random access memory, 8000 more transistors require little additional chip space. Single poly and single metal with transistor gate lengths of 0.8 μm are used in conjunction with the current state of the semiconductor art to complete a system for wireless communication between chips operating in the 2.5 GHz range.

It is to be understood that although the present invention has been described in a preferred embodiment, various modifications known to those skilled in the art may be made without departing from the spirit of the invention, as recited in the several claims appended hereto.

What is claimed is:

1. A single electronic component comprising:
   (a) a first semiconductor chip comprising:
      (1) a first circuit for providing a first signal conveying information; and
      (2) a first transmitter for broadcasting information conveyed by the first signal; and
   (b) a second semiconductor chip comprising:
      (1) a first receiver for receiving the transmitted information, without any physical connection to the first semiconductor chip and independent of any alignment between the first semiconductor chip and the second semiconductor chip, and for providing a second signal conveying the transmitted information; and
      (2) a second circuit responsive to the second signal; and
   (c) a first enclosure, surrounding the first semiconductor chip and the second semiconductor chip, composed of an electrically conductive material for maintaining communication between the first transmitter and the first receiver of the single electronic component.

2. A single electronic component comprising:
   a plurality of semiconductor chips which transfer data among each other, wherein each chips includes a transceiver, and wherein the transceiver of each chip includes
      a transmitter for modulating a radio frequency (RF) signal with data and for transmitting the modulated RF signal in a radiation pattern which encompasses each of the chips; and
      a receiver for receiving the respective modulated RF signal from the transmitter of each of the other chips, independent of the physical alignment between each two chips within said plurality of chips, wherein the received signals are received through RF wave propagation through space rather than through physical connection between the chips of the single electronic component.

3. The electronic component of claim 2, wherein:
   (a) said component further comprises a power supply for broadcasting a power signal; and
   (b) each of said chips further comprises
      (1) an antenna for receiving said power signal, and
      (2) a rectifying circuit for rectifying said power signal received by said antenna and for powering said receiver.

4. The electronic component of claim 2, wherein:
   each chip further comprises an antenna coupled to the transceiver, the antenna including a loop antenna element and a first dipole antenna element; and
   the loop antenna element and the first dipole antenna element are substantially coplanar.

5. The electronic component of claim 4 wherein the antenna further comprises a second dipole antenna element.

6. The electronic component of claim 5 wherein the first dipole antenna element is substantially perpendicular to the second dipole antenna element.

7. The electronic component of claim 5 wherein the loop antenna element, the first dipole antenna element, and the second dipole antenna element are substantially coplanar.

8. The electronic component of claim 4, wherein each chip is formed on a substrate and the antenna of each chip is formed in a metal layer on the substrate of that chip.

9. The electronic component of claim 8 wherein the antenna comprises aluminum.

10. The electronic component of claim 4 wherein the antenna is characterized by a substantially omnidirectional sensitivity.

11. The electronic component of claim 2, wherein:
   each chip further comprises an antenna coupled to the transceiver, the antenna including a first dipole antenna element and a second dipole antenna element; and
   the first dipole antenna element and the second dipole antenna element are substantially perpendicular.

12. The electronic component of claim 11 wherein the antenna is characterized by a substantially omnidirectional sensitivity.

13. The electronic component of claim 11, wherein the first dipole antenna element and the second dipole antenna element are substantially coplanar.

14. The electronic component of claim 13, wherein each chip is formed on a substrate and the antenna of each chip is formed in a metal layer on the substrate of that chip.

15. The electronic component of claim 14 wherein the antenna comprises aluminum.

16. An electronic component according to claim 2, further comprising:
   a housing providing RF shielding;
   a wherein each of the chips in mounted within the housing.

17. An electronic component according to claim 2, further comprising:
   a power source for broadcasting an electromagnetic power signal to each of the chips;
   wherein each of the chips further includes a circuit for receiving the power signal and converting it to a voltage for supplying power to the transceiver of the chip without any physical connection to any power wire bus outside the chip.

18. An electronic component according to claim 17, further comprising:
   a housing providing RF shielding;
   wherein each of the chips and the power source are mounted within the housing.

19. An single electrical circuit comprising:
   (a) a first semiconductor chip comprising:
      (1) a first circuit for providing a first signal conveying information; and
      (2) a first transmitter for broadcasting information conveyed by the first signal; and
   (b) a second semiconductor chip comprising:
      (1) a first receiver for receiving the transmitted information, without any physical connection to the first semiconductor chip and independent of any alignment between the first semiconductor chip and the second semiconductor chip and for providing a second signal conveying the transmitted information; and
      (2) a second circuit responsive to the second signal; and
   (c) a first metal enclosure, surrounding the first semiconductor chip and the second semiconductor chip, for maintaining communication between the first transmitter and the first receiver of the single electrical circuit.

20. An single electrical circuit having a plurality of semiconductor chips which transfer data among each other, comprising:
   said plurality of semiconductor chips, wherein
      each chip includes a transmitter for modulating a radio frequency (RF) signal with data and for transmitting the modulated RF signal in a radiation pattern which encompasses each of the chips, and
      each chip includes a receiver for receiving the respective modulated RF signal from the transmitter of each of the other chips, independent of the physical alignment between each two chips within said plurality of chips, wherein the received signals are received through RF wave propagation through space rather than through physical connection between the chips; and a metal enclosure, surrounding all of the chips, for maintaining communication among the chips of the single electrical circuit.

21. A method of manufacturing an single electronic component, comprising the steps of:

providing an enclosure composed of electrically conductive material; and mounting within the enclosure a plurality of semiconductor chips, wherein each chip includes an RF transceiver for transmitting data to, and receiving data from, the other chips independent of the physical alignment between each two chips within said plurality of chips, and wherein the chips are mounted without any physical connectors between the chips for transferring said data;

whereby the electrically conductive enclosure maintains communication among the chips of the single electronic component.

* * * * *